United States Patent
Chang et al.

(10) Patent No.: US 10,219,411 B1
(45) Date of Patent: Feb. 26, 2019

(54) IDENTITY RECOGNITION DEVICE

(71) Applicant: MSI COMPUTER (SHENZHEN) CO., LTD., Shenzhen, Guangdong Province (CN)

(72) Inventors: Hung Chang, New Taipei (TW); Min-Lang Chen, New Taipei (TW)

(73) Assignee: MSI COMPUTER (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 15/867,135

(22) Filed: Jan. 10, 2018

(30) Foreign Application Priority Data

Dec. 1, 2017 (TW) .............................. 106142153 A

(51) Int. Cl.
*H05K 7/20* (2006.01)
*F28D 15/02* (2006.01)
*H05K 5/02* (2006.01)

(52) U.S. Cl.
CPC ..... *H05K 7/20336* (2013.01); *F28D 15/0275* (2013.01); *H05K 5/02* (2013.01); *H05K 7/2039* (2013.01)

(58) Field of Classification Search
CPC .. H05K 7/20336; H05K 7/20409; H05K 5/02; F28D 15/0275
USPC ................................................. 361/700, 715
See application file for complete search history.

(56) References Cited

U.S. PATENT DOCUMENTS

| 7,277,286 B2 * | 10/2007 | Lee ........................... G06F 1/20 174/15.2 |
| 9,611,392 B2 * | 4/2017 | Hsin ........................ C09D 5/00 |
| 2004/0218362 A1 * | 11/2004 | Amaro ...................... G06F 1/20 361/697 |
| 2005/0129928 A1 * | 6/2005 | Lee ........................ B82Y 30/00 428/323 |

* cited by examiner

*Primary Examiner* — Mukundbhai G Patel
(74) *Attorney, Agent, or Firm* — Maschoff Brennan

(57) ABSTRACT

The disclosure is related to an identity recognition device. The identity recognition device includes a thermal conductive casing, an identity recognition module, a heat dissipation assembly, and a heat dissipation coating. The heat dissipation assembly includes a plurality of heat pipes, a heat absorbing block and a first heat sink. The heat pipes are disposed on the thermal conductive casing, and are in thermal contacts with the thermal conductive casing. The heat absorbing block is in thermal contacts with the identity recognition module, and two opposite sides of the first heat sink respectively are in thermal contacts with the heat pipes and the heat absorbing block. The heat dissipation coating is coated on the thermal conductive casing and the heat pipes, wherein the thermal conductivity of the heat dissipation coating is larger than the thermal conductivities of the thermal conductive casing and the heat pipes.

10 Claims, 5 Drawing Sheets

IDENTITY RECOGNITION DEVICE

CROSS-REFERENCE TO RELATED APPLICATIONS

This non-provisional application claims priority under 35 U.S.C. § 119(a) on Patent Application No(s). 106142153 filed in Taiwan, R.O.C. on Dec. 1, 2017, the entire contents of which are hereby incorporated by reference.

TECHNICAL FIELD

The disclosure relates to an identity recognition device, more particularly an identity recognition device having a heat dissipation coating.

BACKGROUND

As technology progresses and develops, biometric recognition for access control or time attendance control becomes more and more popular. Biometric recognition includes facial recognition, fingerprint scanners and more, which can instantly verify a person's identity.

Taking a facial recognition device for example, the facial recognition device now is widespreadly used in many countries, and it is usually installed at the entrance of a building or in an outdoor place in order to identify the people in a specific area. Especially, the facial recognition device is often placed in the space where there is a large flow of people, so people might have a great chance to touch it. Therefore, the surface temperature of the facial recognition device should be limited to within a safe range, such as 60° C.

SUMMARY OF THE INVENTION

One embodiment of the disclosure provides an identity recognition device. The identity recognition device includes a thermal conductive casing, an identity recognition module, a heat dissipation assembly, and a heat dissipation coating. The heat dissipation assembly includes a plurality of heat pipes, a heat absorbing block and a first heat sink. The heat pipes are disposed on the thermal conductive casing, and are in thermal contacts with the thermal conductive casing. The heat absorbing block is in thermal contacts with the identity recognition module, and two opposite sides of the first heat sink respectively are in thermal contacts with the heat pipes and the heat absorbing block. The heat dissipation coating is coated on the thermal conductive casing and the heat pipes, wherein the thermal conductivity of the heat dissipation coating is larger than the thermal conductivities of the thermal conductive casing and the heat pipes.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
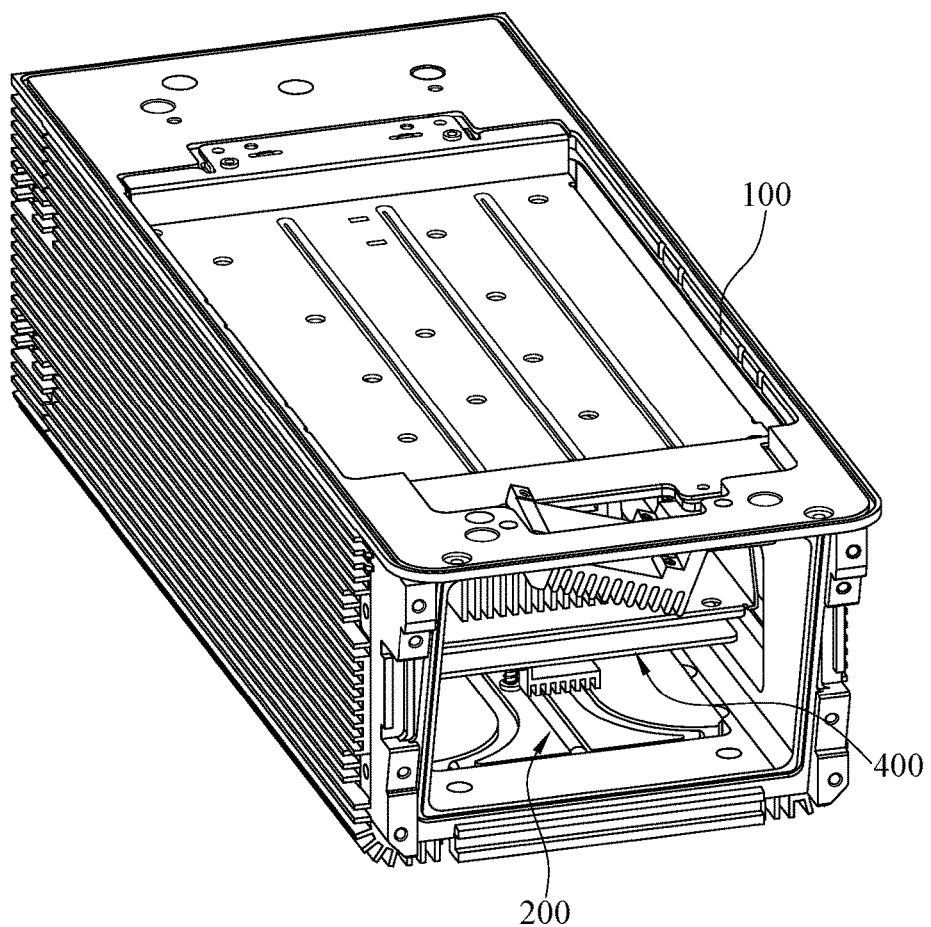
FIG. 1 is a perspective view of an identity recognition device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2A:
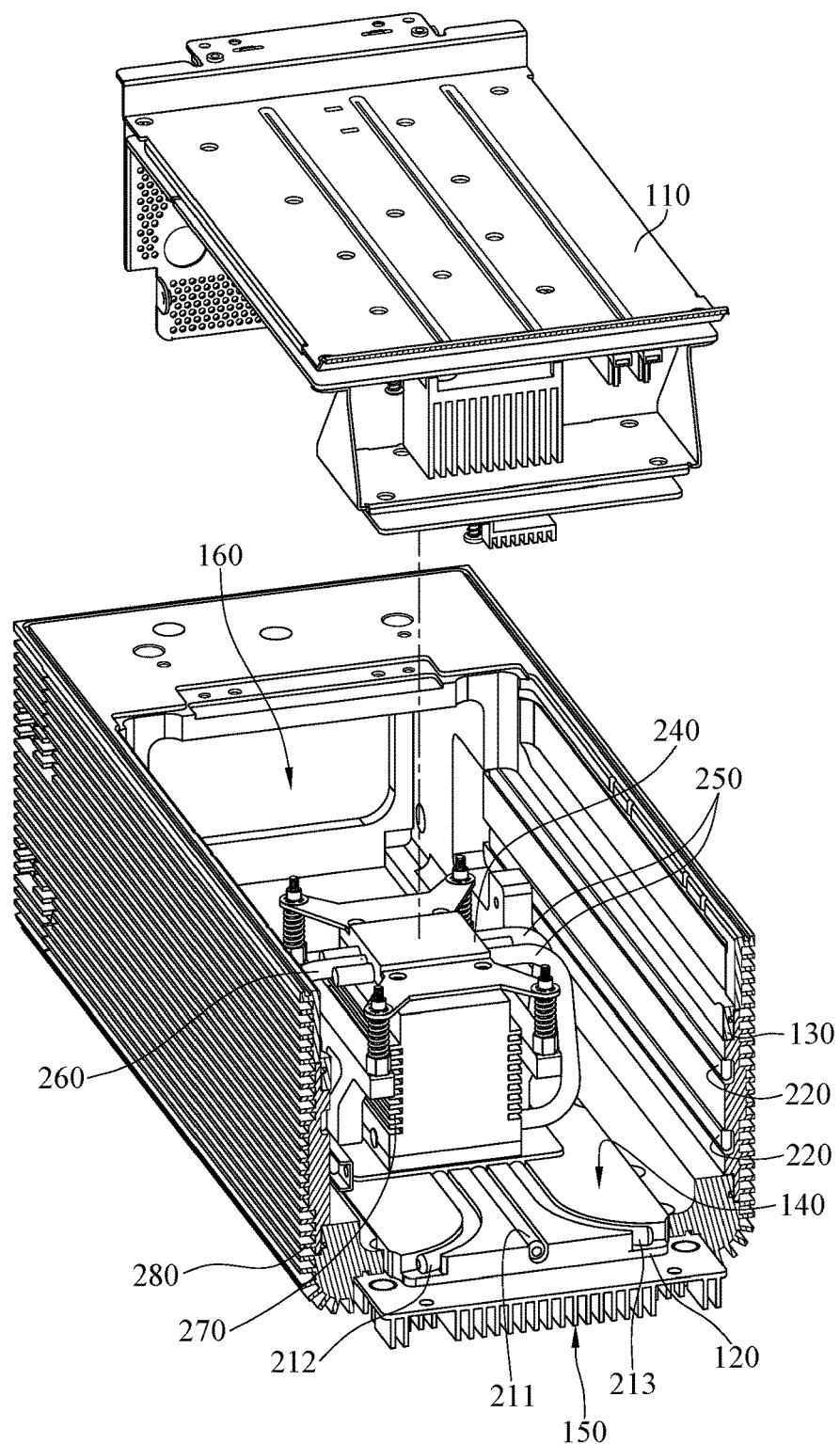
FIG. 2A is an exploded and partial cross-sectional view of the identity recognition device in FIG. 1.
Figure 2B:
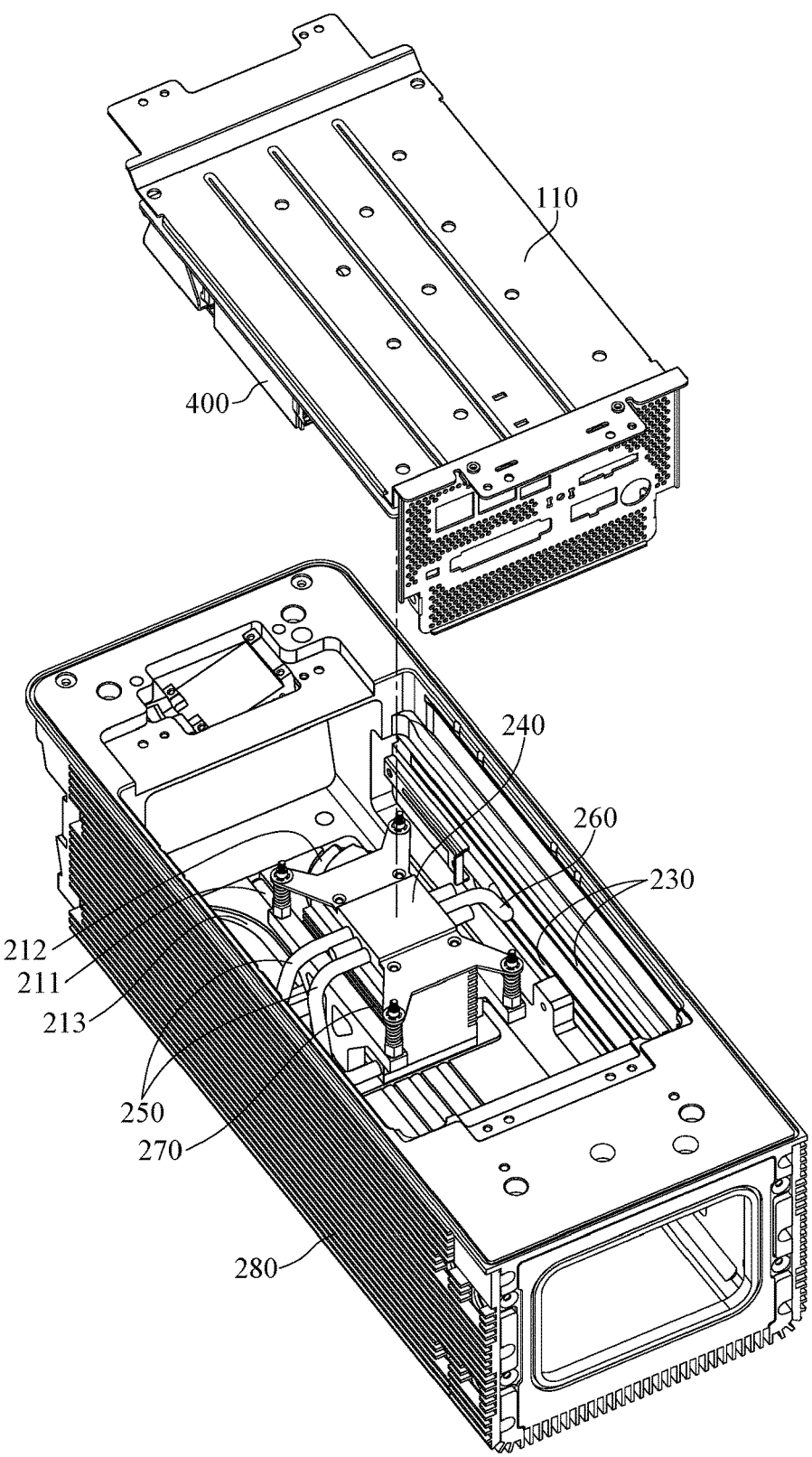
FIG. 2B is an exploded view of the identity recognition device in FIG. 1.
Figure 3:
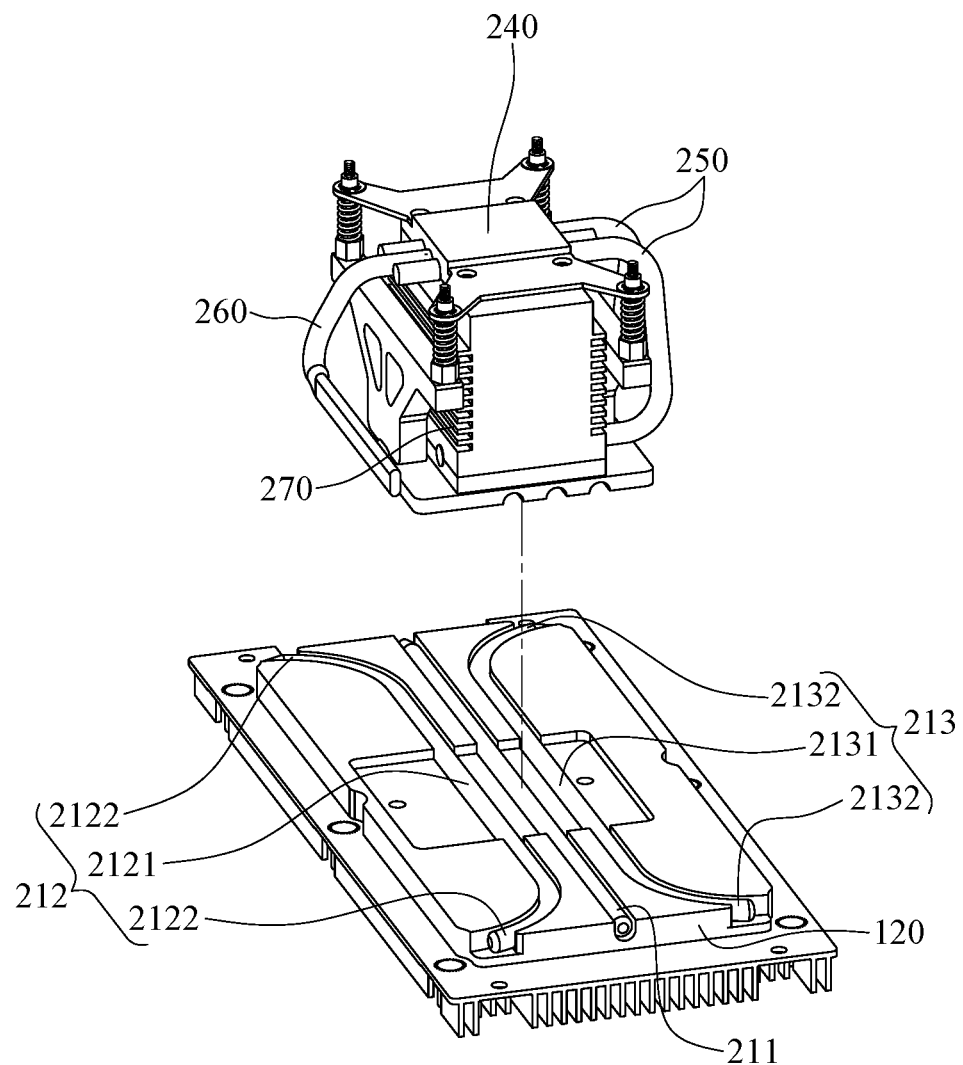
FIG. 3 is an exploded view of a first heat sink and the back plate in FIG. 1.

Please refer to FIG. 1 to FIG. 3. FIG. 1 is a perspective view of an identity recognition device according to a first embodiment of the disclosure. FIG. 2A is an exploded and partial cross-sectional view of the identity recognition device in FIG. 1. FIG. 2B is an exploded view of the identity recognition device in FIG. 1. FIG. 3 is a perspective view of the first heat sink detached from the back plate in FIG. 1.

This embodiment provides an identity recognition device 10. The identity recognition device 10 includes a thermal conductive casing 100, a heat dissipation assembly 200, a heat dissipation coating 300 and an identity recognition module 400.

The thermal conductive casing 100 is made of, for example, aluminum. The thermal conductive casing 100 includes a front plate 110, a back plate 120, and an annular side plate 130. The back plate 120 and the front plate 110 are opposite to each other, and the annular side plate 130 is connected to and located between the front plate 110 and the back plate 120, such that the front plate 110, the back plate 120 and the annular side plate 130 together form an accommodating space 160. The thermal conductive casing 100 has an inner surface 140 and an outer surface 150, the inner surface 140 forms the accommodating space 160, and the outer surface 150 is opposite to the inner surface 140.

The heat dissipation assembly 200 is disposed in the accommodating space 160, and the heat dissipation assembly 200 includes three first heat pipes 211-213, two second heat pipes 220, two third heat pipes 230, a heat absorbing block 240, two first thermal conductive pipe 250, a second thermal conductive pipe 260, a first heat sink 270 and a second heat sink 280. In this embodiment, the first heat pipes 211-213, the second heat pipes 220 and the third heat pipes 230 are all made of, for example, copper, and they are all located in the accommodating space 160. The first heat pipes 211-213 are embedded into the back plate 120 by welding. In more detail, the first heat pipe 211 is located between the first heat pipe 212 and the first heat pipe 213. The first heat pipe 212 includes a straight part 2121 and two curve parts 2122, and the straight part 2121 is connected to and located between the two curve parts 2122. The first heat pipe 213 includes a straight part 2131 and two curve parts 2132, and the straight part 2131 is connected to and located between the two curve parts 2132. The curve parts 2122 of the first heat pipe 212 and the curve parts 2132 of the first heat pipe 213 extend outward from each other.

The second heat pipes 220 and the third heat pipes 230 are respectively embedded into two opposite sides of the annular side plate 130.

Two opposite ends of each first thermal conductive pipe 250 are respectively connected the heat absorbing block 240 and the three first heat pipes 211-213, and two opposite ends of the second thermal conductive pipe 260 are respectively connected to the heat absorbing block 240 and the annular side plate 130. Two opposite sides of the first heat sink 270 are respectively in thermal contact with the first heat pipes 211-213 and the heat absorbing block 240. The second heat sink 280 is disposed on outer side of the thermal conductive casing 100, thus it is understood that the outer surface 150 is on the second heat sink 280.

In this embodiment, the second thermal conductive pipe 260 is directly in thermal contact with the annular side plate 130, but the present disclosure is not limited thereto. In some other embodiments, there may be a thermal conductive pad disposed between the second thermal conductive pipe 260 and the annular side plate 130, such that the second thermal conductive pipe 260 would be thermally connected to the annular side plate 130 through the thermal conductive pad; that is, the second thermal conductive pipe 260 is thermally connected to the annular side plate 130 in an indirect manner.

In addition, the numbers of the first heat pipes 211-213, the second heat pipes 220 and the third heat pipe 230 are not restricted, and they all can be adjusted according to actual requirements.

Figure 4:
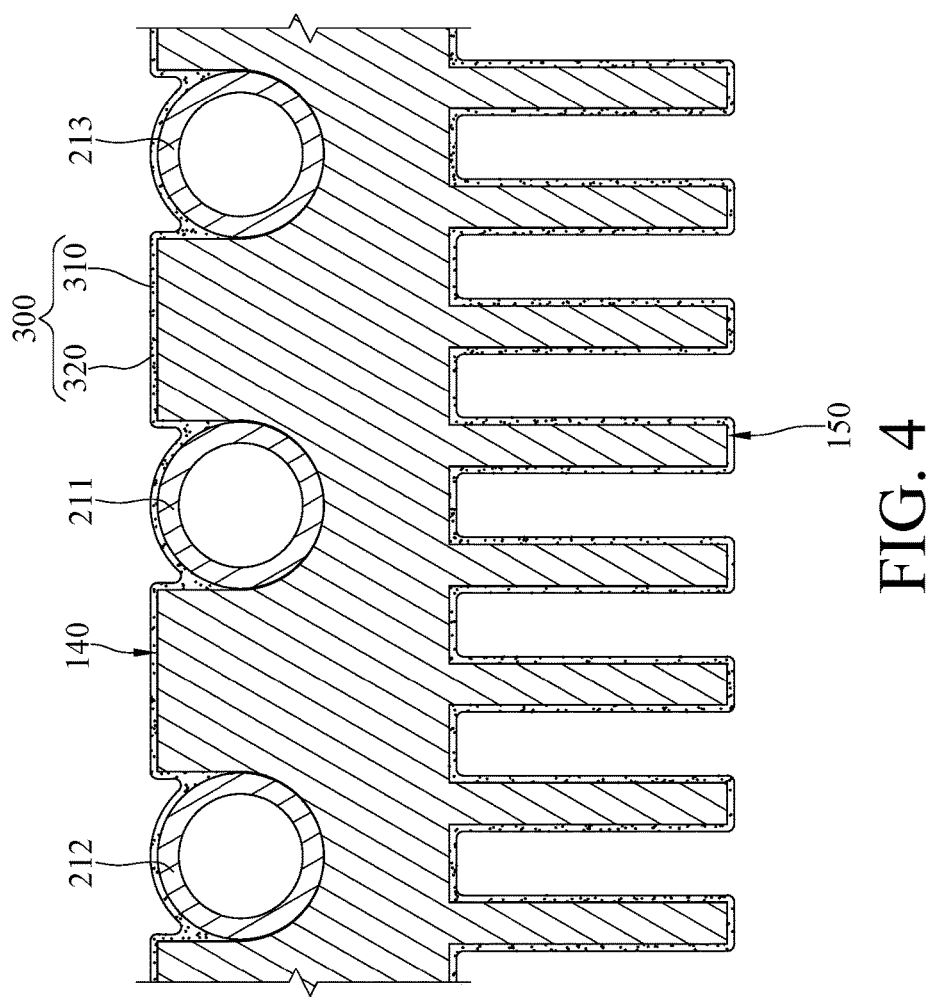
FIG. 4 is a partial cross-sectional view of the back plate in FIG. 1.

Please refer to FIGS. 2A-2B and further refer to FIG. 4. FIG. 4 is a partial cross-sectional view of the back plate in FIG. 1. The heat dissipation coating 300 is coated on the outer surface 150 and the inner surface 140 of the thermal conductive casing 100 so as to cover the first heat pipes 211-213, the second heat pipes 220 and the third heat pipe 230, as shown in FIG. 4. The thermal conductivity of the heat dissipation coating 300 is larger than that of the thermal conductive casing 100, the first heat pipes 211-213, the second heat pipes 220 and the third heat pipes 230. The heat dissipation coating 300 includes a waterproof adhesive 310 and carbon nano-powder 320. The carbon nano-powder 320 is mixed in the waterproof adhesive 310. The thickness of the heat dissipation coating 300 ranges between 50 μm and 130 μm. Please refer to FIG. 1 again, the identity recognition module 400 is located in the accommodating space 160, and the heat absorbing block 240 is in thermal contact with the identity recognition module 400.

In this embodiment, the range of the thickness of the heat dissipation coating 300 helps the heat dissipation coating 300 to effectively dissipate heat from the identity recognition device 10. In detail, if the heat dissipation coating 300 is too thin, it will not be able to effectively dissipate heat from the identity recognition device 10. On the other hand, if the heat dissipation coating 300 is too thick, heat from the identity recognition device 10 will be difficult to be dissipated through the heat dissipation coating 300. According to experiment result, the aforementioned range of the thickness of the heat dissipation coating 300 is the most proper range for removing heat from the identity recognition device 10.

In addition, the waterproof adhesive 310 is not restricted to be mixed with the carbon nano-powder 320. In some other embodiments, the waterproof adhesive 310 may be mixed with the ceramic nano-powder.

The following describes steps of assembling the identity recognition device 10.

The thermal conductive casing 100 is produced through aluminum extrusion process, and then the first heat pipes 211-213, the second heat pipes 220 and the third heat pipe 230 are welding on the thermal conductive casing 100. Then, oil stain on the thermal conductive casing 100 and these pipes will be removed by an ultrasonic cleaning machine. Then, the heat dissipation coating 300 is coated on the inner surface 140 of the thermal conductive casing 100 and covers the first heat pipes 211-213, the second heat pipes 220 and the third heat pipe 230. Then, the heat dissipation coating 300 is cured and firmly attached while being heated at 200° C. Then, the identity recognition module 400 is installed in the thermal conductive casing 100, and the front plate 110 is mounted on the thermal conductive casing 100 to finish the process of assembling the identity recognition device 10.

In this embodiment, the thermal conductivity of the heat dissipation coating 300 is greater than that of the thermal conductive casing 100 and the first heat pipes 211-213, the second heat pipes 220 and the third heat pipe 230, and the heat dissipation coating 300 helps to evenly dissipate heat produced by the identity recognition module 400. As a result, the heat dissipation coating 300 is able to increase the thermal conductivity of the thermal conductive casing 100 from 180 W/mK to above 200 W/mK and to increase the overall thermal conductivity of these pipes 211-213, 220 and 230 from 380 W/mK to above 400 W/mK. Accordingly, without fan or enlarging size, the surface temperature of the identity recognition device 10 still meets the regulations in many countries. For example, in Japan, the surface temperature of the identity recognition device is not allowed larger than 60° C. since it will directly contact human skin.

In a real case, while the identity recognition device 10 is in operation, its maximum surface temperature is only 56° C. This is a prove that the heat dissipation coating 300 can effectively increase the capability of heat dissipation of the identity recognition device 10. In another case, if the carbon nano-powder 320 is replaced with the ceramic nano-powder, the maximum surface temperature of the identity recognition device 10 becomes 59° C., but it still meets the regulation in Japan.

In addition, since the identity recognition device 10 has no fan, dust accumulation inside the identity recognition device 10 is prevented.

Furthermore, since the heat dissipation coating 300 includes the waterproof adhesive 310, such that the identity recognition device 10 becomes waterproof. A real test shows that the waterproof level of the identity recognition device 10 is IP 54. Thus, the identity recognition device 10 is prevented from rusting. In addition, the heat dissipation capacity of the identity recognition device 10 is better than that of the identity recognition device which is only coated with protective paint. In detail, the temperature of the outer surface of the identity recognition device only coated with protective paint is 62° C. while in operation, so this type of identity recognition device fails to meet the regulation of surface temperature issued by the government in Japan. In contrast, the surface temperature of the identity recognition device 10 in operation meets the regulation in Japan.

In Japan, there is another regulation related to the maximum lifetime of an identity recognition device. As discussed in above, the identity recognition device 10 is excellent in heat dissipation, is prevented from dust accumulation and is waterproof, which is beneficial to extend its service life so as to meet the said regulation.

According to the identity recognition device as discussed above, the heat dissipation coating is coated on the thermal conductive casing and the heat pipes, and the thermal conductivity of the heat dissipation coating is larger than that of the thermal conductive casing and the heat pipes, which helps to evenly dissipate heat produced by the identity recognition module so as to increase the heat dissipation area of the identity recognition device. As a result, the overall thermal conductivity of the identity recognition device is increased. Accordingly, without fan or enlarging size, the surface temperature of the identity recognition device still meets the regulations in many countries In addition, since the identity recognition device has no fan, dust accumulation inside the identity recognition device is prevented.

Moreover, since the heat dissipation coating includes the waterproof adhesive, such that the identity recognition device becomes waterproof and is prevented from rusting.

The aforementioned merits of the identity recognition device are beneficial to extend the service life of the identity recognition device.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An identity recognition device, comprising:
   a thermal conductive casing;
   an identity recognition module;
   a heat dissipation assembly comprising a plurality of heat pipes, a heat absorbing block and a first heat sink, the heat pipes disposed on the thermal conductive casing and in thermal contact with the thermal conductive casing, the heat absorbing block in thermal contact with the identity recognition module, and two opposite sides of the first heat sink respectively in thermal contact with the heat pipes and the heat absorbing block; and
   a heat dissipation coating coated on the thermal conductive casing and the heat pipes; wherein the thermal conductivity of the heat dissipation coating is larger than the thermal conductivities of the thermal conductive casing and the heat pipes;
   wherein the thermal conductive casing comprises a front plate, a back plate, and an annular side plate, the back plate and the front plate are opposite to each other, the annular side plate is connected to and located between the front plate and the back plate, such that the front plate, the back plate and the annular side plate together form an accommodating space, the identity recognition module and the heat dissipation assembly are located in the accommodating space, the plurality of heat pipes comprise at least one first heat pipe, at least one second heat pipe, and at least one third heat pipe, the at least one first heat pipe is embedded into the back plate, and the at least one second heat pipe and the at least one third heat pipe are respectively embedded into two opposite sides of the annular side plate.

2. The identity recognition device according to the claim 1, wherein the number of the at least one first heat pipe is three, the number of the at least one second heat pipe is two, and the number of the at least one third heat pipe is two.

3. The identity recognition device according to the claim 2, wherein the identity recognition device further comprises at least one first thermal conductive pipe and at least one second thermal conductive pipe, two opposite ends of the at least one first thermal conductive pipe are respectively connected to the heat absorbing block and the first heat pipes, and two opposite ends of the at least one second thermal conductive pipe are respectively connected to the heat absorbing block and the annular side plate.

4. The identity recognition device according to the claim 3, wherein the heat dissipation assembly further comprise a thermal conductive pad which is disposed on the annular side plate and in thermal contact with the third heat pipes, and the at least one second thermal conductive pipe is thermally connected to the annular side plate and the third heat pipes through the thermal conductive pad.

5. The identity recognition device according to the claim 2, wherein two of the three first heat pipes, which are respectively located at two opposite sides of the other first heat pipe, each has a straight part and two curve parts respectively connected to two opposite ends of the straight part.

6. The identity recognition device according to the claim 1, wherein the thermal conductive casing has an outer surface and an inner surface opposite to each other, the inner surface form the accommodating space, the heat pipes is disposed on the inner surface of the thermal conductive casing, and the heat dissipation coating is coated on the outer surface and the inner surface.

7. The identity recognition device according to the claim 6, wherein the heat dissipation assembly further comprise a second heat sink disposed on the outer surface.

8. The identity recognition device according to the claim 1, wherein the heat dissipation coating comprises a waterproof adhesive and a carbon nano-powder, the carbon nano-powder is mixed in the waterproof adhesive, and the waterproof adhesive is coated on the thermal conductive casing.

9. The identity recognition device according to the claim 1, wherein the heat dissipation coating comprises a waterproof adhesive and a ceramic nano-powder, the ceramic nano-powder is mixed in the waterproof adhesive, and the waterproof adhesive is coated on the thermal conductive casing.

10. The identity recognition device according to the claim 1, wherein the thickness of the heat dissipation coating ranges between 50 μm and 130 μm.

* * * * *